(12) United States Patent
Kawai et al.

(10) Patent No.: US 9,294,044 B2
(45) Date of Patent: Mar. 22, 2016

(54) BIAS CIRCUIT AND AMPLIFIER

(71) Applicant: KABUSHIKI KAISHA TOSHIBA, Minato-ku, Tokyo (JP)

(72) Inventors: Shusuke Kawai, Fujisawa (JP); Masahiro Hosoya, Yokohama (JP); Tong Wang, Kawasaki (JP); Toshiya Mitomo, Yokohama (JP); Shigehito Saigusa, Yokohama (JP); Tetsuro Itakura, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/213,946

(22) Filed: Mar. 14, 2014

(65) Prior Publication Data

US 2014/0300419 A1 Oct. 9, 2014

(30) Foreign Application Priority Data

Apr. 3, 2013 (JP) .................................. 2013-077906

(51) Int. Cl.
*H03F 3/04* (2006.01)
*H03F 1/30* (2006.01)

(52) U.S. Cl.
CPC ............ *H03F 1/301* (2013.01); *H03F 2200/18* (2013.01); *H03F 2200/447* (2013.01); *H03F 2200/78* (2013.01)

(58) Field of Classification Search
CPC ..... H03F 1/0227; H03F 3/195; H03F 1/0277; H03F 3/245; H03F 2200/27; H03F 2200/504; H03F 2200/451; H03F 2200/18; H03F 3/193; H03F 1/301; H03F 2200/78; H03F 3/189
USPC .......................... 330/285, 289, 296, 302, 311
See application file for complete search history.

(56) References Cited

U.S. PATENT DOCUMENTS

| | | | |
|---|---|---|---|
| 6,304,108 B1 * | 10/2001 | Inn ................................... | 327/72 |
| 7,053,695 B2 * | 5/2006 | Ozasa et al. .................. | 327/541 |
| 7,443,245 B2 * | 10/2008 | Tsurumaki et al. ........... | 330/285 |
| 7,489,196 B2 * | 2/2009 | Vaiana et al. .................. | 330/289 |
| 7,733,186 B2 * | 6/2010 | Hosoya et al. ................ | 330/296 |
| 8,093,952 B2 * | 1/2012 | Behzad et al. ................ | 330/288 |

FOREIGN PATENT DOCUMENTS

JP 2006-081009 A 3/2006

* cited by examiner

*Primary Examiner* — Khanh V Nguyen
(74) *Attorney, Agent, or Firm* — Holtz, Holtz & Volek PC

(57) ABSTRACT

A bias circuit according to an embodiment is a bias circuit that supplies a bias voltage to an amplifying element. The bias circuit of the embodiment includes a first current source that has a characteristic of varying an output current with the surrounding temperature variations, and a second current source that has a different output characteristic from the first current source and that can control the output current. The bias circuit of the embodiment also includes a comparator for comparing the output current of the first current source with the output current of the second current source, and a bias supply part that controls the output current of the second current source on the basis of the comparison result of the comparator and supplies a bias voltage to the amplifying element in accordance with the comparison result.

12 Claims, 2 Drawing Sheets

BIAS CIRCUIT AND AMPLIFIER

CROSS-REFERENCE TO RELATED APPLICATIONS

This application is based upon and claims the benefit of priority from Japanese Patent Application No. 2013-077906, filed on Apr. 3, 2013; the entire contents of which are incorporated herein by reference.

FIELD

Embodiments described herein relate generally to a bias circuit and an amplifier.

BACKGROUND

One exemplary configuration of known bias circuits used for amplifiers, in particular high frequency amplifiers, includes a separate current-generating transistor in addition to an amplifying transistor, and decides a bias current of the amplifying transistor on the basis of a difference in the current flowing in these two transistors. In this configuration, it is possible to decide the current that will flow to the amplifying transistor by setting beforehand the current to flow to the current-generating transistor.

In such configuration, if the current of the current-generating transistor decreases due to certain changes in the surround environment (e.g., an increase in the ambient temperature), the current of the amplifying transistor also decreases. In other words, there is a problem that a gain of the amplifier drops as the current of the current-generating transistor drops due to the variations in the surrounding environment.

DETAILED DESCRIPTION

Objects of embodiments are to provide a bias circuit that can suppress a decrease in gain, which is caused by changes in the surrounding environment, and to provide an amplifier that uses such bias circuit.

A bias circuit according to the embodiment is a bias circuit that is configured to supply an amplifying element with a bias voltage. The bias circuit of the embodiment includes a first current source that has a characteristic of changing its output current in accordance with changes in the ambient temperature (surrounding temperature), and a second current source that has a different output characteristic from the first current source and can control its output current. The bias circuit of the embodiment also includes a comparing part or comparator that compares the output current of the first current source with the output current of the second current source, and a bias supply part that controls the output current of the second current source on the basis of the comparison result of the comparing part and supply the bias voltage, which corresponds to the comparison result, to the amplifying element.

First Embodiment

Figure 1:
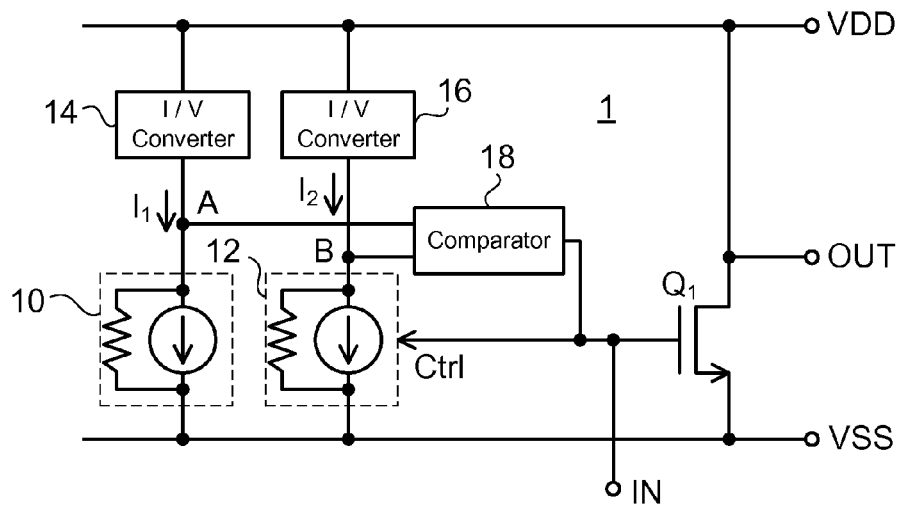
FIG. 1 is a block diagram showing a circuit configuration of an amplifier according to a first embodiment.

Now, embodiments will be described in detail with reference to the drawings. As shown in FIG. 1, an amplifier 1 of the first embodiment has a first current source 10, a second current source 12, an amplifying element $Q_1$, and a comparing part (comparator) 18.

Figure 2:
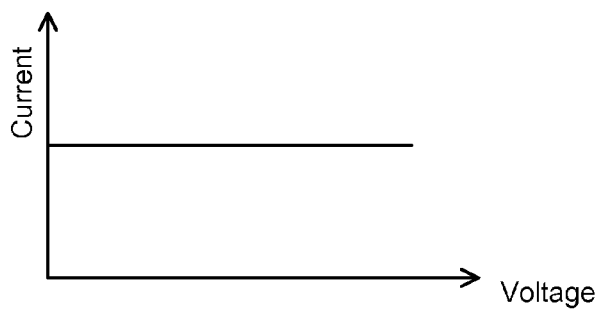
FIG. 2 illustrates voltage-current characteristics of a first current source 10 shown in FIG. 1.

The first current source 10 is a current source that possesses temperature dependency, and outputs (generates) a predetermined current. As shown in FIG. 2, the first current source 10 has a characteristic that the output current does not depend on the voltage at the output terminal. The first current source 10 has an infinite or very large output resistance (e.g., 1 kiloohms or more).

Figure 3:
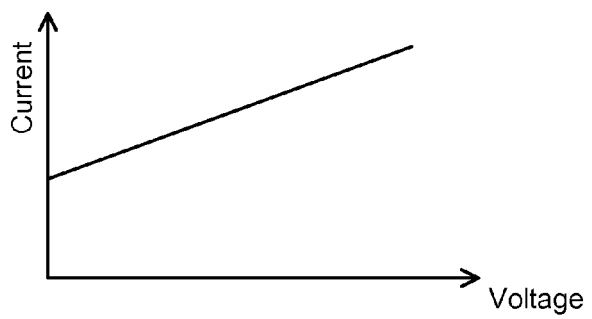
FIG. 3 illustrates voltage-current characteristics of a second current source 12 shown in FIG. 1.

The second current source 12 is a current source that has a smaller temperature dependency than the first current source 10, and can control the output with a control signal (control voltage) received at a control terminal Ctrl. As shown in FIG. 3, the second current source 12 has a characteristic that the output current depends on the voltage at the output terminal. The second current source 12 has an finite output resistance (e.g., several hundred ohms).

As illustrated in FIG. 1, the first current source 10 is connected to a power source VDD via an I/V converter 14, which converts the flowing current to a voltage, and connected to a reference potential VSS. Likewise, the second current source 12 is connected to the power source VDD via an I/V converter 16, which converts the flowing current to a voltage, and to the reference potential VSS. The I/V converters 14 and 16 are implemented in the form of, for example, resistors. The control terminal Ctrl of the second current source 12 is connected to the gate of the amplifying element $Q_1$.

The drain of the amplifying element $Q_1$ is connected to the power source VDD and the output terminal OUT, and the source of the amplifying element is connected to the reference potential VSS. The amplifying element $Q_1$ has, for example, a C-MOS type temperature dependency, and possesses a characteristic that the gain remains or decreases as the ambient temperature rises. The temperature dependency of the power source VDD and reference potential VSS is negligibly small. The gate of the amplifying element $Q_1$ is connected to the control terminal Ctrl of the second current source 12 and the input terminal IN. Thus, the amplifier 1 includes a common source and a bias circuit which is a combination of two current sources.

The comparing part or comparator 18 detects a potential difference between a connection of the first current source 10 and the I/V converter 14, and another connection of the second current source 12 and the I/V converter 16 (i.e., between the points "A" and "B" in FIG. 1), and generates a control signal to be sent to the control terminal Ctrl of the second current source 12 on the basis of the detection result. The comparator 18 controls the control signal such that the potential difference between the points "A" and "B" in FIG. 1 becomes small (or becomes zero).

Now, the biasing operation of the amplifier 1 will be described. If the current flowing in the first current source 10 is designated by $I_1$, the current flowing in the second current source 12 is designated by $I_2$, the conversion coefficient for converting a current to a voltage in the I/V converter 14 is designated by $R_1$, and the conversion coefficient for converting the current to the voltage in the I/V converter 16 is designated by $R_2$, then the current $I_2$ is given by the following equations 1 and 2.

$$I_1 R_1 = I_2 R_2 \quad (1)$$

$$I_2 = \frac{R_1}{R_2} I_1 \quad (2)$$

As such, it is possible to copy the value of the current $I_1$ having the temperature dependency onto the current $I_2$ by appropriately selecting the conversion coefficients $R_1$ and $R_2$. When the copying of the value of the current $I_1$ onto the current $I_2$ stabilizes (finishes), the comparator 18 is able to supply a control voltage, as a stable bias, to the amplifying element $Q_1$. Specifically, the control voltage is supplied to the gate of the amplifying element $Q_1$, and the amplifying element $Q_1$ amplifies a signal which is received at the input terminal IN, and outputs the amplified signal to the output terminal OUT.

As described above, in the amplifying apparatus 1 of this embodiment, the two current sources, which have different temperature dependency and output characteristics (output resistances), are connected between the power source VDD and the reference potential VSS via the associated current/voltage converters, respectively. The control voltage of the second current source 12 (or corresponding voltage) is supplied, as a bias, to the gate of the amplifying element $Q_1$.

Figure 4:
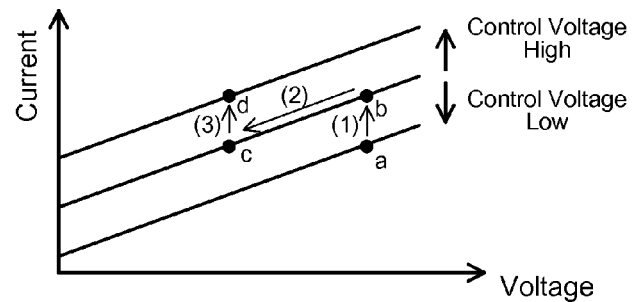
FIG. 4 illustrates relationship between the voltage and current at an output terminal of the second current source 12 shown in FIG. 1.
Figure 5:
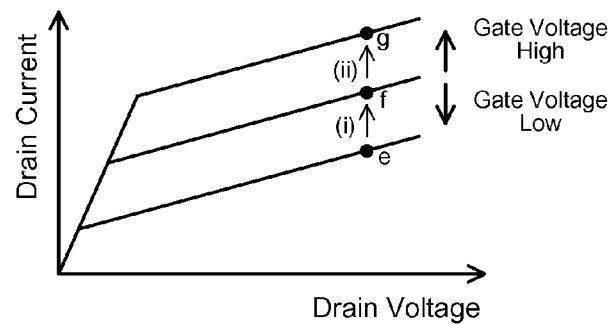
FIG. 5 illustrates drain voltage-drain current characteristics of an amplifying element $Q_1$ shown in FIG. 1.

Referring now to FIGS. 4 and 5, a principle of overcompensation of the gain to the temperature in the amplifying apparatus 1 of this embodiment will be described in detail. It should be noted that although the amplifying element $Q_1$ is depicted to have a finite output resistance in FIG. 5, the amplifying element may be assumed to have a "very large output resistance".

Firstly, it is assumed that the operating point of the second current source 12 at room temperature (normal temperature) is the point "a" in FIG. 4, and the operating point of the amplifying element $Q_1$ is the point "e" in FIG. 5. As the surrounding temperature of the amplifier 1 rises, the output current $I_1$ of the first current source 10 increases because of its temperature dependency. Upon the increase of the current $I_1$, the voltage value converted in the I/V converter 14 increases, and the voltage drop at the I/V converter 14 increases. Accordingly, the voltage at the point "A" in FIG. 1 (i.e., the potential relative to the reference potential VSS. This definition is used hereinafter) drops.

As described above, the comparator 18 increases the control voltage to reduce the potential difference between the points "A" and "B" in FIG. 1 (i.e., such that the voltage drop ($I_1 \times R_1$) at the I/V converter 14 becomes equal to the voltage drop ($I_2 \times R_2$) at the I/V converter 16). As a result, the output current $I_2$ of the second current source 12 increases, the operating point of the second current source 12 shifts to the point "b" from the point "a" in FIG. 4 (indicated by "(1)" in FIG. 4), and the operating point of the amplifying element $Q_1$ shifts to the point "f" from the point "e" in FIG. 5 (indicated by "(i)" in FIG. 5).

As the output current $I_2$ of the second current source 12 increases, the voltage drop at the I/V converter 16 becomes large, and the voltage at the point "B" in FIG. 1 decreases. Then, as shown in FIG. 3, the output current of the second current source 12 decreases because the second current source 12 has the temperature dependency on the output terminal voltage (voltage at the point "B") as shown in FIG. 3 (i.e., because the second current source has a finite output resistance). Thus, the operating point shifts to the point "c" from the point "b" in FIG. 4 (indicated by "(2)" in FIG. 4).

On the other hand, the drain voltage of the amplifying element $Q_1$ is fixed by the power source VDD so that the operating point of the amplifying element $Q_1$ remains at the point "f" in FIG. 5.

As the operating point shifts to the point "c" from the point "b" and the output current $I_2$ decreases, the value of the current $I_2$ becomes lower than the value of the current $I_1$. Thereupon, the comparator 18 further increases the control voltage to satisfy the equation 1 and increases the current $I_2$. As a result, the operating point of the second current source 12 shifts to the point "d" from the point "c" in FIG. 4 (indicated by "(3)" in FIG. 4). On the other hand, the operating point of the amplifying element $Q_1$ shifts to the point "g" from the point "f" (indicated by "(ii)" in FIG. 5) because the gate voltage (i.e., bias) increases upon the increase of the control voltage. In other words, the drain current of the amplifying element $Q_1$ increases.

As understood from the foregoing, the amplifier 1 of this embodiment has a bias circuit that is configured by the combination of the two current sources having different temperature dependency and output characteristics. Therefore, even if the rise in temperature or other phenomena occur which causes an increase in the output current of the current source, it is possible to increase the bias voltage to be supplied. In other words, the amplification gain tends to increase with the temperature rise, and the overcompensation to the temperature is achieved.

Second Embodiment

Figure 6:
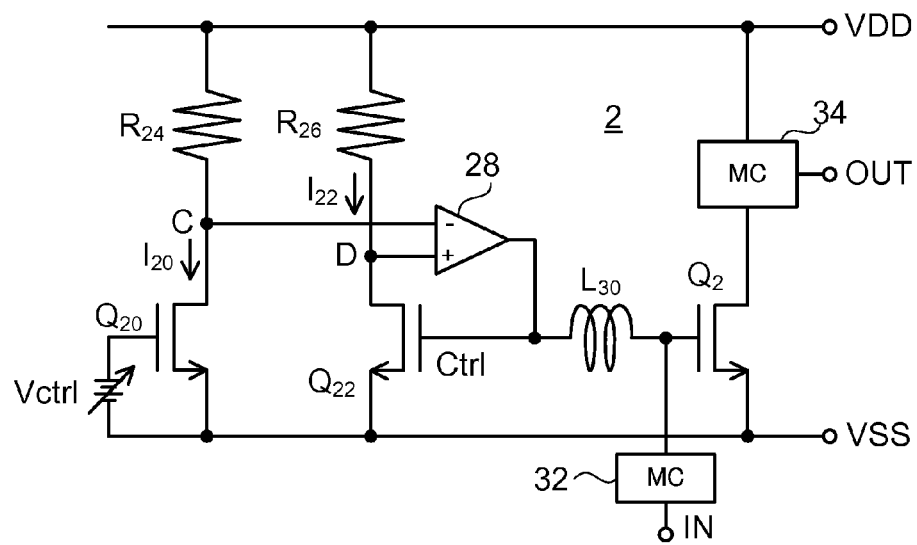
FIG. 6 is a circuit diagram showing an exemplary structure of an amplifier according to a second embodiment.

Referring now to FIG. 6, an amplifier according to the second embodiment will be described in detail. As shown in FIG. 6, the amplifier 2 of this embodiment includes a transistor $Q_{20}$, whose gate voltage is controlled by the power source $V_{ctrl}$ having temperature dependency, a transistor $Q_{22}$, a transistor $Q_2$, and an operational amplifier 28. The transistor $Q_{20}$ corresponds to the first current source 10 of the first embodiment, the transistor $Q_{22}$ corresponds to the second current source 12 of the first embodiment, the transistor $Q_2$ corresponds to the amplifying element $Q_1$ of the first embodiment, and the operational amplifier 28 corresponds to the comparator 18 of the first embodiment.

The drain of the transistor $Q_{20}$ is connected to one end of the resistor $R_{24}$, and the other end of the resistor $R_{24}$ is connected to the power source VDD. The source of the transistor $Q_{20}$ is connected to the reference potential VSS. Likewise, the drain of the transistor $Q_{22}$ is connected to one end of the resistor $R_{26}$, and the other end of the resistance $R_{26}$ is connected to the power source VDD. The source of the transistor $Q_{22}$ is connected to the reference potential VSS. The gate of the transistor $Q_{20}$ is connected to the positive electrode of the power source $V_{ctrl}$ whose negative electrode is connected to the reference potential VSS. The power source $V_{ctrl}$ has temperature dependency. The gate terminal of the transistor $Q_{22}$ and the gate terminal of the transistor $Q_2$ are connected to each other via an inductor $L_{30}$ that cuts off a high frequency component. It should be noted that the transistor $Q_{20}$ may take a cascade form in order to increase the output resistance. Because the output resistance of the transistor $Q_{20}$ is higher than the output resistance of the transistor $Q_{22}$, the relationship of $L_{20} > L_{22}$ is satisfied if the channel length of the transistor $Q_{20}$ is represented by $L_{20}$ and the channel length of the transistor $Q_{22}$ is represented by $L_{22}$.

The output resistance of the transistor $Q_{22}$ (the resistance between the drain and the source) is made lower than the output resistance of the transistor $Q_{20}$ (the resistance between the drain and the source). For example, while the output resistance of the transistor $Q_{20}$ is equal to or greater than about 1000 ohms, the output resistance of the transistor $Q_{22}$ is in the order of several hundred ohms or less. As such, the channel length of the transistor $Q_{20}$ is longer than the channel length of the transistor $Q_{22}$.

The resistors $R_{24}$ and $R_{26}$ serve to convert the output currents of the associated transistors $Q_{20}$ and $Q_{22}$ to voltages, respectively.

The inverting input of the operational amplifier 28 is connected to the drain of the transistor $Q_{20}$ (point "C" in FIG. 6), and the non-inverting input of the operational amplifier 28 is connected to the drain of the transistor $Q_{22}$ (point "D" in FIG. 6). The output of the operational amplifier 28 is connected to the gate of the transistor $Q_{22}$. The operational amplifier 28 controls the voltage to be applied to the gate terminal of the transistor $Q_{22}$ such that the voltage difference between the points "C" and "D" in FIG. 6 becomes zero.

The drain of the transistor $Q_2$ is connected to the power source VDD via a matching circuit 34. The gate of the transistor $Q_2$ is connected to the input terminal IN via another matching circuit 32.

The matching circuit 34 is configured such that the direct current resistance between the power source VDD and the drain of the transistor $Q_2$ becomes very small. Thus, the direct current component of the drain potential of the transistor $Q_2$ is substantially equal to the voltage value of the power source VDD.

The biasing operation of the amplifier 2 of this embodiment is the same as the operation of the amplifier 1 of the first embodiment. The output current of the transistor $Q_{20}$ is represented by $I_{20}$ and the current flowing through the transistor $Q_{22}$ is represented by $I_{22}$. Because of the control performed by the operational amplifier 28, the potential at the point "C" becomes equal to the potential of the point "D" in FIG. 6, and therefore the voltage drop across the resistor $R_{24}$ is substantially equal to the voltage drop across the resistor $R_{26}$ if the output resistance of the transistor is sufficiently large. Accordingly, the current $I_{22}$ is given by the equation 3.

$$I_{20}R_{24} = I_{22}R_{26} \qquad (3)$$
$$I_{22} = \frac{R_{24}}{R_{26}} I_{20}$$

As such, it is possible to copy the value of the current $I_{20}$, which has the temperature dependency, on the current $I_{22}$ by appropriately selecting the values of the resistors $R_{24}$ and $R_{26}$. When the copying of the value of the current $I_{20}$ on the current $I_{22}$ is stabilized, the comparator 18 is able to supply the control voltage, as a stable bias, to the amplifying element $Q_2$. Specifically, the control voltage is introduced to the gate of the transistor $Q_2$, and the transistor $Q_2$ amplifies the signal received at the input terminal IN and outputs the resulting signal onto the output terminal OUT.

Conditions for Operating the Second Current Source in a Saturation Zone

The following will discuss the conditions for the transistor $Q_{22}$ (second current source) of the amplifier 2 having the configuration shown in FIG. 6 to operate in a saturation zone even when the surrounding temperature becomes high, as in the first embodiment.

In order for the transistor $Q_{22}$ to operate in a saturation zone, the drain-source voltage of the transistor $Q_{22}$ be higher than the overdrive voltage of the transistor $Q_{22}$. If the drain-source voltage of the transistor $Q_{22}$ in the high temperature environment is represented by $V_{22dsH}$, the gate-source voltage of the transistor $Q_{22}$ in the high temperature environment is represented by $V_{22gsH}$, the threshold voltage of the transistor $Q_{22}$ is represented by $V_{22t}$ and the overdrive voltage is represented by $V_{22OVH}$, then the equation 4 is established.

$$V_{22dsH} > V_{22gsH} - V_{22t} = V_{22OVH} \qquad (4)$$

The drain-source voltage of the transistor $Q_{22}$ is obtained by subtracting the voltage drop across the resistor $R_{26}$ from the voltage of the power source VDD. If the output current of the transistor $Q_{22}$ is represented by $I_{22H}$, then the equation 4 can be expressed in the form of the equation 5.

$$V_{22OVH} < V_{22dsH} = VDD - I_{22H}R_{26} \qquad (5)$$

If the operational amplifier 28 starts the operation and its operation stabilizes, then the drain-source voltage $V_{20dsH}$ of the transistor $Q_{20}$ becomes equal to the drain-source voltage $V_{22dsH}$ of the transistor $Q_{22}$. Thus, if the output current of the transistor $Q_{20}$ is represented by $I_{20H}$ and the output current of the transistor $Q_{22}$ is represented by $I_{22H}$, then the equation 6 is established.

$$V_{20dsH} = V_{22dsH}$$

$$VDD - I_{20H}R_{24} = VDD - I_{22H}R_{26}$$

$$I_{20H}R_{24} = I_{22H}R_{26} \qquad (6)$$

On the other hand, if the drain voltage of the transistor $Q_{20}$ at room temperature is represented by $V_{20dsL}$, the equation 7 is established.

$$VDD = V_{20dsL} + I_{20L}R_{24} \qquad (7)$$

If the variation from the output current $I_{20L}$ of the transistor $Q_{20}$ at room temperature to the output current $I_{20H}$ at high temperature is expressed by $\Delta I_{20}$ ($= I_{20H} - I_{20L}$), and the equations 6 and 7 are used in the equation 5, then the equation 8 is obtained.

$$V_{22OVH} < V_{22dsH} = VDD - I_{22H}R_{26} \qquad (8)$$
$$= V_{20dsL} + I_{20L}R_{24} - I_{20H}R_{24}$$
$$= V_{20dsL} - \Delta I_{20}R_{24}$$

As understood from the foregoing, when the overdrive voltage of the transistor $Q_{22}$ in the high temperature environment is smaller than a value that is obtained by subtracting a product of the variation $\Delta I_{20}$ of the output current of the transistor $Q_{20}$ upon the environmental change from the room temperature to high temperature and the resistance value of the resistor $R_{24}$ from the drain voltage of the transistor $Q_{22}$ (drain-source voltage) in the room temperature environment, then it is possible to operate the transistor $Q_{22}$ in the saturated condition even in the high temperature environment.

In this manner, it is possible to provide a bias circuit and amplifier having a characteristic of overcompensating the output current in the high temperature environment by having the circuit configuration that satisfies the equation 8, as in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A bias circuit for supplying a bias voltage to an amplifying element, the bias circuit comprising:
   a first current source having an output characteristic of varying an output current in accordance with surrounding temperature variations;
   a first converter which converts the output current of the first current source to a first voltage;
   a second current source having a different output characteristic from the first current source, the second current source having a controllable output current controlled by a control voltage;
   a second converter which converts an output current of the second current source to a second voltage;
   a comparator which compares the first voltage with the second voltage; and
   a bias supply line which connects an output of the comparator with the second current source and the amplifying element to supply a comparison result of the comparator to the second current source as the control voltage and to the amplifying element as a bias.

2. The bias circuit of claim 1, wherein the second current source has an output resistance lower than an output resistance of the first current source.

3. The bias circuit of claim 1,
   wherein the first converter connects to the first current source and a power source to generate the first voltage in accordance with the output current of the first current source, and
   wherein the second converter connects to the second current source and the power source to generate the second voltage in accordance with the output current of the second current source.

4. A bias circuit for supplying a bias voltage to an amplifying transistor, the bias circuit comprising:
   a first transistor having a gate supplied with the bias voltage, a source grounded and a drain, wherein the bias voltage varies in accordance with surrounding temperature variations;
   a first resistor having one end connected to the drain of the first transistor and another end connected to a power source;
   a second transistor having a gate, a source grounded and a drain;
   a second resistor having one end connected to the drain of the second transistor and another end connected to the power source;
   an operational amplifier which compares a drain voltage of the first transistor with a drain voltage of the second transistor to supply a drain voltage difference to the gate of the second transistor as a control voltage and to a gate of the amplifying transistor as the bias voltage.

5. The bias circuit of claim 4, wherein a channel length of the first transistor is longer than a channel length of the second transistor.

6. The bias circuit of claim 4, wherein an equation of $$V_{OV} < V_{ds} - \Delta I R_1$$

is satisfied, where Vas is the drain voltage of the second transistor at room temperature, $V_{OV}$ is an overdrive voltage of the second transistor at a temperature higher than the room temperature, $R_1$ is a resistance value of the first resistor, and $\Delta I$ is an output current variation of the first transistor upon a change in the surrounding temperature from the room temperature to the temperature higher than the room temperature.

7. An amplifier having the bias circuit defined by claim 1.

8. An amplifier having the bias circuit defined by claim 2.

9. An amplifier having the bias circuit defined by claim 3.

10. An amplifier having the bias circuit defined by claim 4.

11. An amplifier having the bias circuit defined by claim 5.

12. An amplifier having the bias circuit defined by claim 6.

* * * * *